United States Patent [19]

Tapscott

[11] 4,039,943
[45] Aug. 2, 1977

[54] POSITION SENSITIVE ANTI-TAMPER WATTHOUR METER

[75] Inventor: Hunter P. Tapscott, Raleigh, N.C.

[73] Assignee: Westinghouse Electric Corporation, Pittsburgh, Pa.

[21] Appl. No.: 663,336

[22] Filed: Mar. 3, 1976

[51] Int. Cl.² .......................... G01R 11/24; H02B 9/00
[52] U.S. Cl. ..................................... 324/110; 361/366
[58] Field of Search ................ 324/110, 115; 317/108; 307/119; 200/61, 52

[56] References Cited
U.S. PATENT DOCUMENTS 3,501,697  3/1970  Martin ................................ 324/115

3,915,112  10/1975  Forester ............................... 324/110

Primary Examiner—Rudolph V. Rolinec
Assistant Examiner—Ernest F. Karlsen
Attorney, Agent, or Firm—R. W. Smith

[57] ABSTRACT

An anti-tamper watthour meter includes a gravity actuated switch arrangement for reversing the meter voltage winding connections across the meter terminal blades when the meter is installed in an inverted position. An additional penalty metering arrangement includes a gravity actuated magnetic member which drops into a position adjacent a meter damping permanent magnet when the meter is inverted. The inverted meter operates at a faster than normal metering rate.

7 Claims, 5 Drawing Figures

POSITION SENSITIVE ANTI-TAMPER WATTHOUR METER

BACKGROUND OF THE INVENTION

This invention relates to anti-tamper watthour meters and more particularly to an anti-tamper watthour meter having a voltage winding reversing arrangement including a gravity actuated switch assembly which prevents reverse meter operation upon installing the meter in an inverted position as an attempt to defraud electric utility billing. The invention further relates to an anti-tamper watthour meter which is operated in the inverted position at a faster than normal metering rate by a penalty metering arrangement including a gravity actuated magnetic member positioned adjacent a damping permanent magnet of the meter.

In electric utility metering, the use of induction type watthour meters installed at customers' meter sockets is well known. The electrical energy consumption indicated on a watthour meter register dial indicates a customer' electrical energy usage for purposes of billing by a utility company. In attempts to defraud the utility company, wire seals are broken and the meter is removed from its socket and reinstalled in an inverted position. This permits electric power service to be maintained through the inverted meter and causes the rotating metering movement to be rotated in the reverse direction. The watthour meter registers are driven reversely so that the register dial pointers are driven downscale indicating reduced consumption when actually electrical energy consumption is occurring. Reverse rotation of the watthour metering movement when it is mounted in the inverted position is caused by the reversing of the meter voltage winding connections across the line conductors causing a 180° phase reversal of the voltage winding magnetic field.

It is known to prevent the aforementioned attempt to defraud the utility company by utilizing a detent assembly designated as Style No. 285 A 082 G02 available from the Westinghouse Electric Corporation, Meter Division, Raleigh, N.C. which prevents the meter movement from rotating in the reverse direction. This prevents the down scale operation of the register when the meter is inverted. However, detent does not permit the meter to provide the normal billing indications. A further means of preventing defrauding of the utility companies is the use of a unidirectional register also available from the aforementioned meter manufacturer. The unidirectional register is always driven up scale regardless of the direction of rotation of the watthour metering movement. These unidirectional registers are more expensive, have additional parts and are more complex requiring increased driving torque by the metering movement, are more difficult to manufacture, and are sometimes found less reliable than the simpler standard meter registers.

Another solution to prevent tampering of watthour meters is disclosed in U.S. Pat. No. 3,915,112, issued Oct. 28, 1975, describing a meter position indicator. The patent describes a means for indicating on the front face of a meter cover that the meter has been inverted or rotated 180°. This solution is helpful in detecting tampering of meters but does not prevent defrauding use of the watthour meter. In U.S. Pat. No. 2,546, 693, issued July 9, 1947, an anti-tampering watthour meter is disclosed for preventing defrauding by short-circuiting the meter load or current winding. A relay is provided in the meter having two normally balanced coils and relay contacts which are connected to an auxiliary winding. When the meter is tampered with by providing the aforementioned short-circuited shunt, the auxiliary current winding is energized through the relay contacts to produce a faster than normal rotation of the metering movement. The last described anti-tampering electric meter undesirable includes additional relay coils and a winding and is directed to a type of metering tampering to which the present invention is not intended to prevent. Also, the meter is of the older bottom-connected type and not the socket-mounted type which is detachably mounted and to which the present invention pertains.

SUMMARY OF THE INVENTION

In accordance with the present invention, a position sensitive anti-tamper watthour meter includes a voltage winding reversing arrangement formed by a gravity actuated switch assembly for connecting the ends of the meter voltage winding across a pair of the meter terminal blades. The voltage winding ends are reversely connected between the pair of terminal blades when the meter is in the inverted position relative to the winding connections when the meter is in the normal upright positon. The rotating metering movement is driven in the same direction in response to the consumption of electric energy to be measured in either of the two reversed meter mounting positions. In one preferred embodiment, two liquid contact switches forming a single pole double throw switch connections are connected between the voltage winding ends and the terminal blades. In another preferred embodiment, a double pole double throw switch is connected between the winding ends and the pair of terminal blades and the switch has a pivotally mounted arm with a weighted free end. The arm actuates the switch in the inverted meter position to effect reversal of the voltage winding connections.

A further preferred embodiment of this invention includes a penalty metering arrangement in combination with the above voltage winding reversing arrangement formed by a gravity actuated magnetic member which is positioned adjacent the meter damping permanent magnet upon the meter being placed in the inverted positon. The magnetic member shunts the permanent magnet field of the damping magnet away from the watthour meter disc so that the disc is rotated at an increased speed that is normally provided for normal metering operation. Two alternative embodiments of the gravity actuated magnetic member include either a slidable magnetic member carried in a sleeve or a free swinging magnetic member carried on the end of a pivotally mounted arm.

Accordingly, it is a general feature of this invention to provide an anti-tamper watthour meter including a gravity actuated switch assembly for causing the metering movement to be rotated in the same direction when the meter is mounted in either of two vertical positions. It is a further feature of this invention to provide a gravity actuated magnetic member for increasing the metering rate of a watthour meter operating in an inverted position so as to penalize a customer having an improperly mounted meter. A still further feature of this invention is to provide an anti-tamper meter which is simply manufactured and incudes devices operated by gravity so as to not require critical manufacturing or operating tolerances or additional loading of the metering movement so that the anti-tampering features are reliable in operation during the extended life expectancy of watthour meters used in widely varying ambient conditions.

DESCRIPTION OF THE PREFERRED EMBODIMENT

Figure 1:
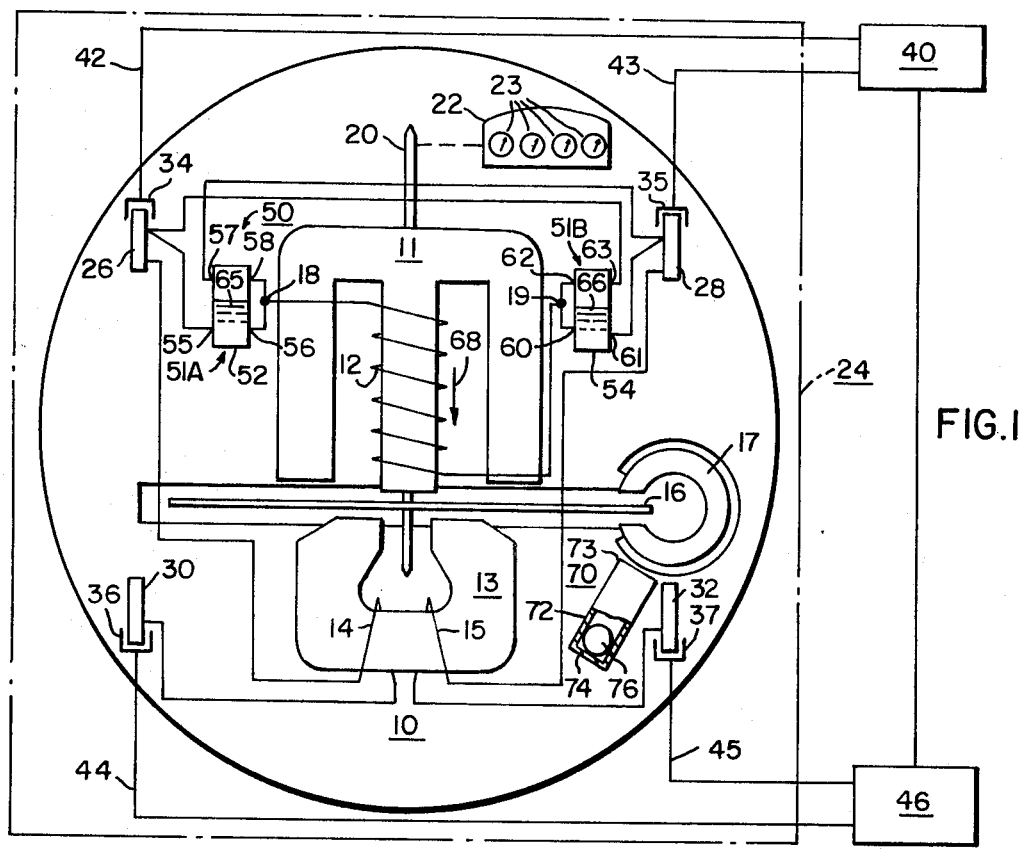
FIG. 1 is a schematic view of a position sensitive anti-tamper watthour meter made in accordance with the present invention and shown connected for metering the electric loads of a utility customer.

Referring now to the drawings wherein the same numeral is used to indicate the same or like elements and more particularly to FIG. 1 wherein a position sensitive anti-tamper watthour meter 10 is shown as made in accordance with one preferred embodiment of this invention. The meter 10 is a single phase induction watthour meter being of the socket mounted type. The general construction of the watthour meter 10 is disclosed in U.S. Pat. No. 3,309,152 issued Mar. 14, 1967, and assigned to the assignee of this invention, for purposes of an example and not limitation. An electromagnetic metering movement of the meter 10 includes an E-shaped core 11 carrying a voltage winding 12 and a core 13 carrying current windings 14 and 15. The voltage and current windings inductively drive a conductive disc 16. The disc is rotated at a rate proportional to the product of the voltage across the terminal ends 18 and 19 of the voltage winding 12 and the current through the current windings 14 and 15. A disc supporting shaft 20 rotatably drives a kilowatt hour indicating register 22 having dial pointers 23. The shaft 20 is vertically oriented along the vertical axis of the meter for proper meter operation when the meter 10 is mounted for operation at a meter socket housing 24 at an electric utility customer's premises.

The meter 10 is shown in FIG. 1 in the normally vertically upright position when mounted by a first pair of horizontally aligned top terminal blades 26 and 27 and a second pair of horizontally aligned bottom terminal blades 30 and 32. The bottom blades 30 and 32 are vertically aligned with the blades 26 and 28, respectively, in the conventional manner of socket-type watthour meters presently manufactured for use by electric utility companies. Contact jaws 34, 35, 36 and 37 of the meter socket housing 24 receive the terminal blades 26, 28, 30 and 32, respectively, in the proper upright operating position shown in FIG. 1. Typically, the upper contact jaws 34 and 35 are connected to the line side or incoming conductors 42 and 43 which are connected to a distribution network and the utility company furnished electrical source 44. The lower contact jaws 36 and 37 are connected to the load side conductors 44 and 45 which are connected to a customer's electric load 46.

In accordance with the present invention a voltage winding reversing arrangement is provided by a gravity actuated switch assembly 50 including two substantially identical liquid contact switch devices 51A and 51B arranged to form single pole double throw switch devices. The switch devices are formed by elongated enclosed tubes 52 and 54 made of a suitable insulating material such as glass. The tubes 52 and 54 are mounted in the meter 10 so that the elongated length thereof is non-horizontal and substantially parallel to the shaft 20. The tube 52 has a first pair of stationary contacts 55 and 56 and a second pair of contacts 57 and 58. The contacts 55 and 56 are aligned with each other and extend through the tube 52 at one end thereof. The contacts 57 and 58 are also aligned with each other and extend through the tube 52 at a second end thereof. Similarly, the tube 54 includes two pairs of stationary contacts 60 and 61 and 62 and 63 in a substantially identical manner that the tube 52 carries the two pairs of stationary contacts 55 and 56 and 57 and 58. The tubes 52 and 54 include movable liquid contacts 65 and 66 formed of a conductive liquid material, preferably mercury. the liquid contacts 65 and 66 flow between the ends of the tubes 52 and 54 due to gravity when the meter is rotated between the upright and inverted positions shown in FIGS. 1 and 2, respectively. Accordingly, the liquid contacts 65 and 66 connnect the contacts 55 and 56 and 60 and 61 in the upright position shown in FIG. 1 and the contacts 57 and 58 and 62 and 63 in the inverted position of FIG. 2.

The stationary contacts of the switch devices 51A and 51B are connected to form a single pole double throw switch mode of operation. The contacts 56 and 58 are connected together to form the common pole of the switch device 51A and in turn they are connected to the voltage winding end 18. Similarly, contacts 60 and 62 are connected together in the switch device 51B and to the voltage winding end 19. The stationary contacts 55 and 63 are each connected to the terminal blade 26 and the stationary contacts 57 and 61 are connected to the terminal blade 28.

In the upright position of the meter 10 shown in FIG. 1, the meter is connected in a normal manner of connecting watthour meters so that the magnetic fields of the current windings 14 and 15 and of the voltage winding 12 are directed through the disc 16 in response to the electrical energy developed through the conductors 42, 43, 44 and 45. The disc 16 is rotated in a direction for up scale indication at the register 22 in accordance with the conventional operation of single phase watthour meters as described in pages 91-98 of the Electrical Metermen's Handbook, 7th edition, published by Edison Electric Institute, 90 Park Ave., New York, NY 10016. The directional arrow 68 in FIG. 1 represents the polarity of the voltage winding 12 to produce the desired direction of rotation of the disc 16. This is in accordance with the connection to the conductors 42 and 43. In a conventional meter where the winding ends 18 and 19 are fixedly connected to the terminal blades 26 and 28, installation of the meter would reversely connect the winding ends across the power line conductors so that the polarity of the voltage coil 12 would be reversed and therefore develop a reverse torque on the disc 16 causing the shaft 20 and register 22 to be driven in a reverse direction.

Figure 2:
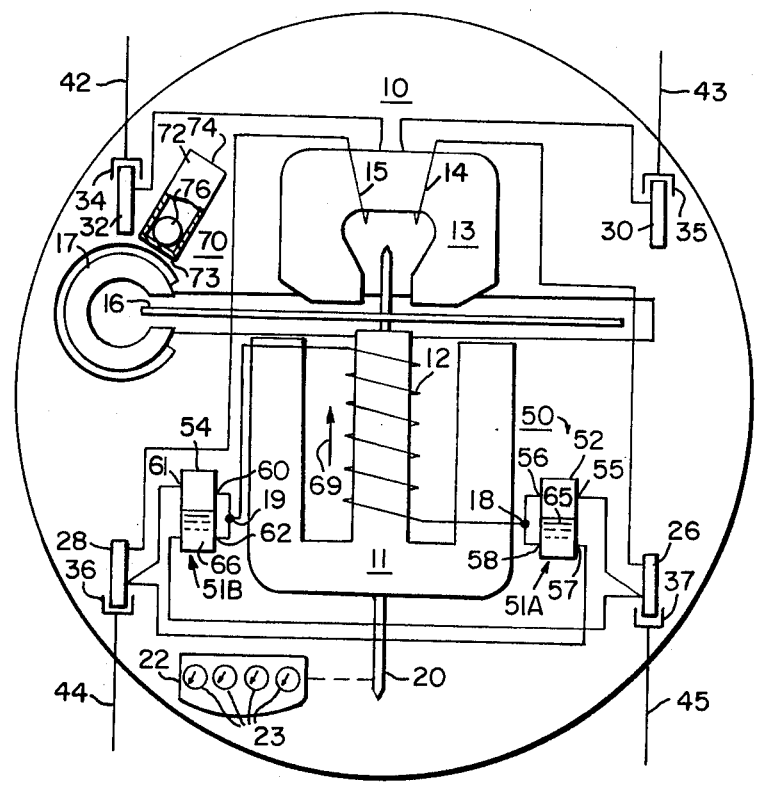
FIG. 2 is a schematic view of the anti-tamper watthour meter illustrated in FIG. 1 in an inverted mounted position.

In accordance with the operation of the present invention, when the attempt to defraud the billing of a customer by removing the watthour meter 10 and mounting it in the inverted position as shown in FIG. 2, the terminal blades 32, 30, 28 and 26 are mated with the socket contact jaws 34, 35, 36 and 37, respectively. In this position, the gravity actuated switch assembly 50 has the liquid contacts 65 and 66 interconnecting the stationary contacts 57 and 58 and 62 and 63, respectively, so that the voltage winding ends 18 and 19 are now connected across the conductors 44 and 45 which are connected in series through the current windings 15 and 14 to the line conductors 42 and 43 so as to produce the same polarity, indicated by the directional arrow 69, at the voltage winding 12. This will provide the same direction of torque and rotation on the disc 16 so that the register 22 will be driven in the up scale direction and the pointers 23 will meter the consumption of electrical energy supplied through the conductors 42 and 43 and 44 and 45.

Another important feature of the present invention includes the penalty metering arrangement 70 including a cylindrical sleeve 72 having first and second closed ends. The sleeve 72 has mounted therein a magnetic member slidable between the ends 73 and 74. The magnetic member 76 is preferably a ball made of cold rolled steel or of a suitable magnetic material which will absorb a magnetic field. The sleeve 72 is fixedly mounted in a non-horizontal orientation preferably vertical or at a small acute angle relative to the vertical axis of the shaft 20. The sleeve 72 is also mounted so that the first sleeve end 73 is positioned adjacent the damping magnet 17. Accordingly, in the upright meter position of FIG. 1, the magnetic member 76 rests against the second end 74 and spaced in a substantially magnetically uncoupled relationship with the damping magnet 17. When the meter is in the inverted position of FIG. 2 the magnetic member 76 slides to the first end and adjacent the damping magnet 17.

The use of a damping permanent magnet such as the damping magnet 17 is well known in watthour meters to provide a magnetic brake and retarding function as described at pages 98 and 99 of the aforementioned Electrical Metermen's Handbook. Damping permanent magnets are also disclosed in the U.S. Pat. Nos. 3,076,934, issued Feb. 5, 1963, 3,143,704, issued Aug. 4, 1974, 3,173,067, issued Mar. 9, 1965 and the above-identified U.S. Pat. No. 3,309,152, all assigned to the assignee of this invention. It is further noted that the general construction of the watthour meter 10 may be as shown in the aforementioned U.S. Pat. No. 3,309,152. As described in the aforementioned references, the damping permanent magnet 17 directs a magnetic flux through the disc 16 which produces a retarding force as the disc 16 moves through the field of the permanent magnet 17. The amount of retarding force on the disc 16 is proportional to the intensity of the magnetic flux of the damping magnet 17 and its position relative to the disc. p In operation of the penalty metering arrangement 70, when the meter is in the upright position as shown in FIG. 1, the magnetic member 76 under gravity forces rests against the end 74 and is spaced so as to be substantially magnetically isolated or remote from the field of the damping magnet 17 applied to the disc 16. Thus, the damping magnet 17 provides the normal function of providing a magnetic brake on the disc 17 of a meter not having the penalty metering arrangement 70. When the meter 10 is removed from the upright mounting position and reinstalled in the inverted mounting position as shown in FIG. 2 in an attempt to defraud the electric utility companies, the meter continues to rotate in the proper registering direction of rotation due to the gravity actuated switch assembly 50 as described hereinabove. The magnetic member 76 will assume the position shown in FIG. 2 and rest against the first end 73 of the sleeve 72 so as to be positioned adjacent the damping magnet 17. In this position the magnetic member 76 absorbs or shunts flux away from the gap between the ends of the damping magnet which directs permanent magnet flux through the disc and therefore decreases the braking or retarding effect of the permanent magnet field. The disc 16 is then rotated at a faster rate than normally would be provided so as to provide a metering indication that the register 22, which is higher than the rate at which the electrical energy is being consumed and provided through the conductors 42, 43, 44 and 45. This then provides a penalty for the unauthorized mounting of the meter 10 to further provide a deterence to attempts at defrauding the electric utility company.

Figure 3:
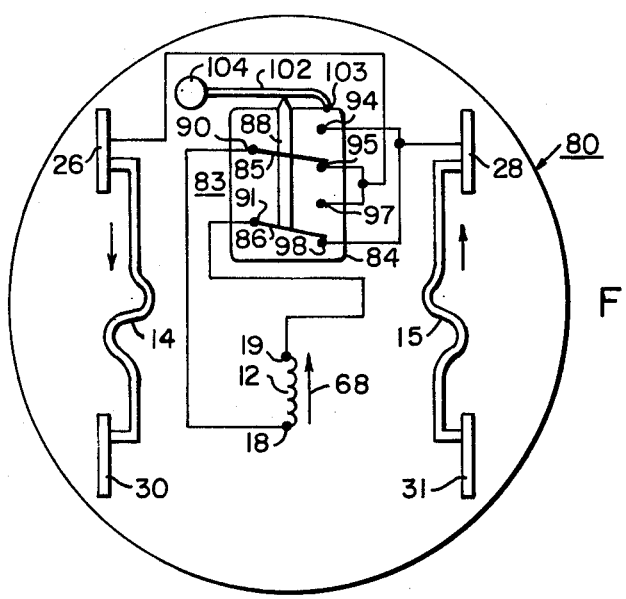
FIG. 3 is a schematic view of a position sensitive anti-tamper watthour meter including an alternative embodiment of a gravity actuated switching assembly shown in FIG. 1.
Figure 4:
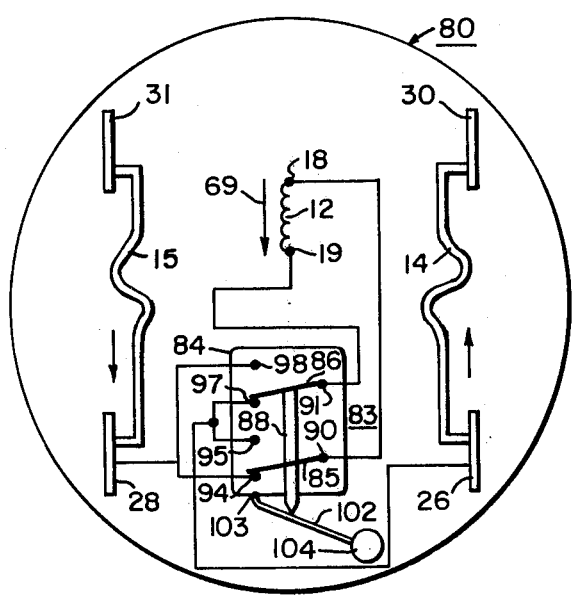
FIG. 4 is a schematic view of the anti-tamper watthour meter illustrated in FIG. 3 in an inverted mounted position.

An alternative embodiment of the voltage winding reversing arrangement is shown in FIGS. 3 and 4 for a watt-hour meter 80 constructed essentially the same as the watthour meter 10 described hereinabove in connection with the description of FIG. 1 and 2 except that a gravity actuated switch assembly is formed by a double pole double throw switch 83 connects the terminal ends 18 and 19 of the voltage winding 12 to the terminal blades 26 and 28 in accordance with the vertical positioning of the watthour meter 80. The switch 83 effectively includes two single pole double throw switches having movable switch arms 85 and 86 connected together by common plunger 88 for moving the switch arms concurrently between either of two contact engaging positions. The common pole terminals 90 and 91 are connected to the voltage winding ends 18 and 19, respectively. The two stationary contacts 94 and 95 associated with the switch arm 85 are connected to the terminal blades 26 and 28, respectively. Similarly, the stationary contacts 97 and 98 associated with the switch arm 86 are connected to the contact blades 26 and 28, respectively.

The switch 83 has associated therewith a pivoted arm having a pivoted mounted end 103 and a free swinging end carrying a weight 104. The swinging arm 102 is aligned with the outer end of the plunger 88 which is mounted for reciprocal motion within the switch housing 84 and resiliently biased outwardly of the switch housing 84 such that in the position shown in FIG. 1 the gravity force on the weight 104 presses the plunger 88 into the housing and causes the switch arms 85 and 86 to connect the terminals 90 and 95 and 91 and 98, respectively. This connects the voltage winding ends 18 and 19 to the terminal blades 26 and 28, respectively, as does the gravity actuated switch assembly 50 in FIG. 1.

When the meter 80 is improperly mounted in the inverted position as shown in FIG. 4, the weight 104 is away from the switch housing 84 to release the plunger 88 which is biased outwardly to show the switch condition shown in FIG. 4. The switch arms 85 and 86 engage the contacts 94 and 97 so as to connect the winding ends 18 and 19 directly to the terminal blades 28 and 26, respectively, thereby reversing the voltage winding connections across these terminal blades and maintain the polarity of the voltage winding 12 the same as described hereinabove in connection with the description of the operation of the gravity actuated switch assembly 50. Accordingly, the voltage winding polarity arrows 68 and 69 are maintained in the same relative directions for producing the same direction of rotation and torque on the disc shown in FIGS. 1 and 2 and continue to drive the register in an up scale direction.

Figure 5:
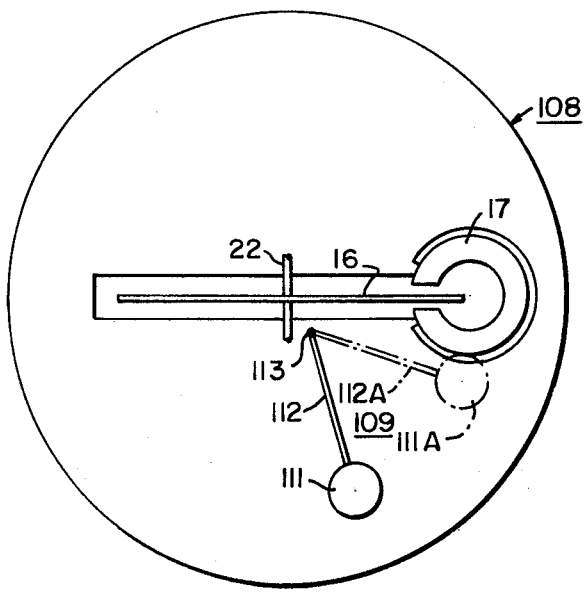
FIG. 5 is a schematic view of an alternative embodiment of a gravity actuated magnetic member illustrated in FIGS. 1 and 2.

A watthour meter 108 is shown in FIG. 5 having the same elements as the watthour meter 10 except for an alternative penalty metering arrangement 109 which replaces the penalty metering arrangement 70 of FIGS. 1 and 2. A magnetic member 111 constructed of a magnetic material such as cold steel and corresponding to the magnetic member 77 of FIGS. 1 and 2 is supported at the end of a pivotally mounted arm 112 pivotally mounted at arm end 113 with the magnetic member 111 mounted at the free end 114 of the arm 112. The said line positions of the magnetic member 111 and the arm are positioned away from the damping magnet 17 when the meter is operating in the upright mounted position. The broken lines 111A and 112A indicate the positions of the magnetic member and arm, respectively, when the meter 108 is inverted and gravity forces positions them adjacent the damping magnet 17. The inverted meter position permits the magnetic member 111 to shunt the flux of the damping permanent magnet 17 to increase the metering rate of the meter 108 as described hereinabove.

While the preferred embodiment described hereinabove constitute preferred forms of the present invention, it is to be understood that it is contemplated that further alternative embodiments of this invention may be made without departing from the spirit and scope of this invention.

I claim:

1. A watthour meter having a metering movement rotatable in response to the flow of electrical energy in a pair of line conductors, said watthour meter comprising;

a first pair of terminal blades for mounting said meter and electrically connecting said meter across the pair of line conductors;

a second pair of terminal blades for mounting said meter and electrically connecting said meter in series with said line conductors;

a pair of current windings connected between separate blades in each of said first and said second pairs of terminal blades;

a voltage winding having first and second terminal ends; and a gravity actuated switch means connecting said first and said second terminal ends of said voltage winding to one and the other of said first pair of terminal blades when said watthour meter is in an upright operating position and reversing the connection of said first and said second terminal ends across said one and said other of said pair of terminal blades when said watthour meter is in an inverted position whereby said metering movement is rotated in the same direction when said meter is mounted in either of said upright or said inverted mounted positions.

2. A watthour meter as claimed in claim 1 wherein said gravity actuated switch means includes first and second liquid contact switch devices connected to said first and said second terminal ends of said voltage winding, respectively, each of said liquid contact switch devices including an enclosed tube containing a liquid conductive material and supporting two pairs of stationary contacts at opposite ends thereof with one of the stationary contacts in each of said first and second pairs of contacts connected to a different one of said terminal blades so that when said meter is rotated between said upright and said inverted operating positions said first and second terminal ends of said voltage winding are reversely connected between said first pair of blade terminals.

3. A watthour meter as claimed in claim 1 wherein said gravity actuated switch means includes first and second single pole double throw switch devices each including a common pole terminal and a pair of stationary contact terminals, each of said common pole terminals connected to a separate one of said first and said second terminal ends and each of said pair of stationary contact terminals connected to a separated one of said first pair of terminal blades and a weight means responsive to the rotation of said watthour meter between the upright position and the inverted position for reversing the positions of said first and said second single pole double throw switch devices to reverse the connections of said first terminal end and said second terminal end of said voltage winding between said first pair of terminal blades.

4. A watthour meter as claimed in claim 1 wherein said gravity actuated switch means includes a double pole double throw switch means including first and second common pole terminals each associated with first and second stationary contact terminals, each of said common pole terminals connected to said first terminal end and said second terminal end of said voltage winding, respectively, and each of said first stationary contact terminals connected to different ones of said first pair of terminal blades and each of said second stationary contact terminals connected to different ones of said first pair of terminal blades, said double pole double throw switch further including a pair of movable arm members each connecting one of said common pole terminals with either of said first and second stationary contact terminals and a pivotally mounted arm means having a weight attached to a free end thereof for operating said pair of switch arm members between said frst contact terminal and said second contact terminal associated with each of said common pole terminals when said watthour meter is in one of said upright and inverted mounted positions and releasing said switch arm to contact the other of said first and second stationary contact terminals when said watthour meter is rotated to the other of the upright and inverted meter mounting positions.

5. A watthour meter as claimed in claim 1 including a damping permanent magnet, and further including a movable magnetic member supported for movement in a remote and an immediately adjacent position upon said watthour meter being rotated between the upright mounted position and the inverted mounted position so as to increase the normal rate of rotation of said metering movement when said watthour meter is in said inverted mounted position.

6. A watthour meter as claimed in claim 5 wherein said movable magnetic member is carried in a non-horizontally mounted enclosed sleeve made of a non-magnetic material having a first end located adjacent said damping permanent magnet and a second end remotely located from said damping permanent magnet whereupon said magnetic member moves between said second end of said sleeve and said first end of said sleeve upon said meter being rotated between said upright mounted position and said inverted mounted position.

7. A watthour meter as claimed in claim 5 wherein said magnetic member is carried on a pivotally mounted arm for movement between a first position immediately adjacent the damping permanent magnet and a second position remote from said damping permanent magnet due to gravity forces on upright mounted position and said inverted mounted position.

* * * * *